United States Patent
Wu et al.

(10) Patent No.: US 9,871,114 B2
(45) Date of Patent: Jan. 16, 2018

(54) METAL GATE SCHEME FOR DEVICE AND METHODS OF FORMING

(71) Applicant: Taiwan Semiconductor Manufacturing Company, Ltd., Hsin-Chu (TW)

(72) Inventors: Chung-Chiang Wu, Hsin-Chu (TW); Chia-Ching Lee, New Taipei (TW); Da-Yuan Lee, Jhubei (TW); Hsueh Wen Tsau, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/871,580

(22) Filed: Sep. 30, 2015

(65) Prior Publication Data

US 2017/0092740 A1 Mar. 30, 2017

(51) Int. Cl.
*H01L 21/3205* (2006.01)
*H01L 21/4763* (2006.01)
*H01L 21/70* (2006.01)
*H01L 29/66* (2006.01)
*H01L 21/28* (2006.01)
*H01L 29/49* (2006.01)
*H01L 21/8238* (2006.01)

(52) U.S. Cl.
CPC .. *H01L 29/66545* (2013.01); *H01L 21/28026* (2013.01); *H01L 21/28088* (2013.01); *H01L 21/823842* (2013.01); *H01L 29/4966* (2013.01)

(58) Field of Classification Search
CPC ........... H01L 29/4966; H01L 29/66545; H01L 21/28088; H01L 21/823842; H01L 29/4958; H01L 21/28026; H01L 21/823828
USPC ........ 257/369, 412, 407; 438/592, 299, 585, 438/595
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2007/0128775 A1* | 6/2007 | Jeon .................. | H01L 21/28088 438/149 |
| 2008/0102613 A1 | 5/2008 | Elers | |
| 2008/0308896 A1* | 12/2008 | Boescke ........... | H01L 21/28194 257/506 |

(Continued)

FOREIGN PATENT DOCUMENTS

| TW | 200829714 A | 7/2008 |
|---|---|---|
| TW | 201019380 A | 5/2010 |

*Primary Examiner* — Fernando L Toledo
*Assistant Examiner* — Aaron Gray
(74) *Attorney, Agent, or Firm* — Slater Matsil, LLP

(57) ABSTRACT

Gate structures and methods of forming the gate structures are described. In some embodiments, a method includes forming source/drain regions in a substrate, and forming a gate structure between the source/drain regions. The gate structure includes a gate dielectric layer over the substrate, a work function tuning layer over the gate dielectric layer, a metal-containing compound over the work function tuning layer, and a metal over the metal-containing compound, wherein the metal-containing compound comprises the metal as an element of the compound.

20 Claims, 7 Drawing Sheets

(56) References Cited

U.S. PATENT DOCUMENTS

| | | |
|---|---|---|
| 2010/0052070 A1 | 3/2010 | Chung et al. |
| 2010/0181629 A1* | 7/2010 | Hoefler ............. H01L 27/11293 257/402 |
| 2011/0108930 A1* | 5/2011 | Cheng ............... H01L 21/76831 257/412 |
| 2011/0156107 A1* | 6/2011 | Bohr ................. H01L 21/76831 257/288 |
| 2013/0026578 A1* | 1/2013 | Tsau ................ H01L 21/823842 257/368 |
| 2014/0282326 A1 | 9/2014 | Chen et al. |
| 2015/0041905 A1* | 2/2015 | Xie .................... H01L 29/6656 257/369 |

* cited by examiner

METAL GATE SCHEME FOR DEVICE AND METHODS OF FORMING

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally in conventional structures, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
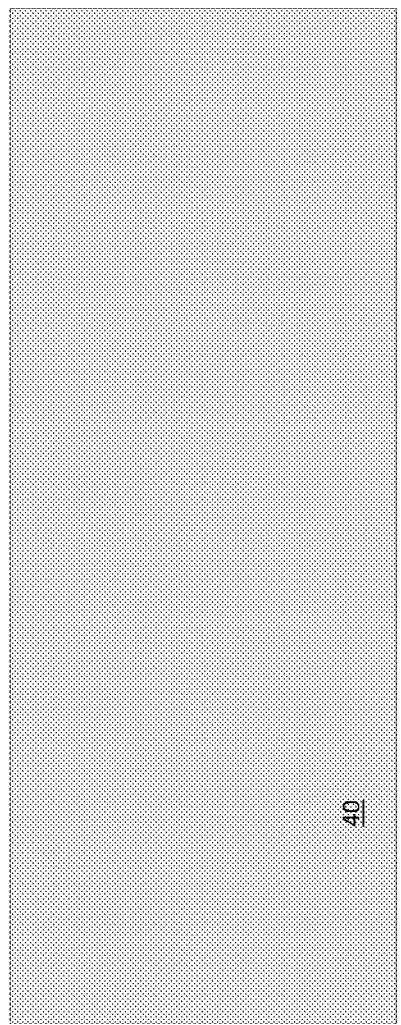
FIGS. 1 through 8 are cross-sectional views of intermediate stages in the manufacturing of a Field-Effect Transistor (FET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field-Effect Transistors (FETs) and methods of forming the same are provided in accordance with various embodiments. Intermediate stages of forming FETs are illustrated. Some embodiments discussed herein are discussed in the context of planar FETs formed using a gate-last process. Some embodiments contemplate aspects used in other devices, such as finFETs. Some embodiments are discussed in the context of p-type devices. Some embodiments are suitable for n-type devices as well. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIGS. 1 through 8 are cross-sectional views of intermediate stages in the manufacturing of a FET in accordance with an exemplary embodiment. FIG. 1 illustrates a substrate 40. The substrate 40 may be a semiconductor substrate, such as a bulk semiconductor substrate, a semiconductor-on-insulator (SOI) substrate, a multi-layered or gradient substrate, or the like. The substrate 40 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 40 may be doped or un-doped. In a specific example, the substrate 40 is a bulk silicon substrate.

Figure 2:

FIG. 2 illustrates the formation of isolation regions 42, such as Shallow Trench Isolation (STI) regions, in the substrate 40. In some embodiments, to form the isolation regions 42, trenches are formed in the substrate 40 by etching. The etching may be any acceptable etch process, such as a reactive ion etch (RIE), neutral beam etch (NBE), the like, or a combination thereof. The etching may be anisotropic. An insulation material is formed in the trenches. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 2, a planarization process, such as a chemical mechanical polish (CMP), may remove any excess insulation material and form top surfaces of the isolation regions 42 and a top surface of the substrate 40 that are co-planar.

Although not specifically illustrated, appropriate wells may be formed in the substrate 40. For example, an n-well may be formed in substrate 40 where a p-type device, such as a p-type FET, is to be formed. For example, to form an n-well in substrate 40, a photoresist can formed over substrate 40. The photoresist can be patterned to expose the region of the substrate 40 in which the n-well is being formed. The photoresist can be formed by using a spin-on technique and can be patterned using acceptable photolithography techniques. Once the photoresist is patterned, an n-type impurity implant can be performed, and the photoresist may act as a mask to substantially prevent n-type impurities from being implanted into the substrate 40 outside of the desired implantation area. The n-type impurities may be phosphorus, arsenic, or the like implanted in the substrate 40 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate impurities that were implanted. The implantations may form an n-well in the substrate 40.

Other embodiments are possible. For example, in the manufacturing of an n-type device, p-type impurities may be implanted into substrate 40, instead of n-type impurities, using the same or similar processes to those described above. The p-type impurities may be boron, BF$_2$, or the like, and may be implanted to a concentration of equal to or less than $10^{18}$ cm$^{-3}$, such as between about $10^{17}$ cm$^{-3}$ and about $10^{18}$ cm$^{-3}$.

Figure 3:
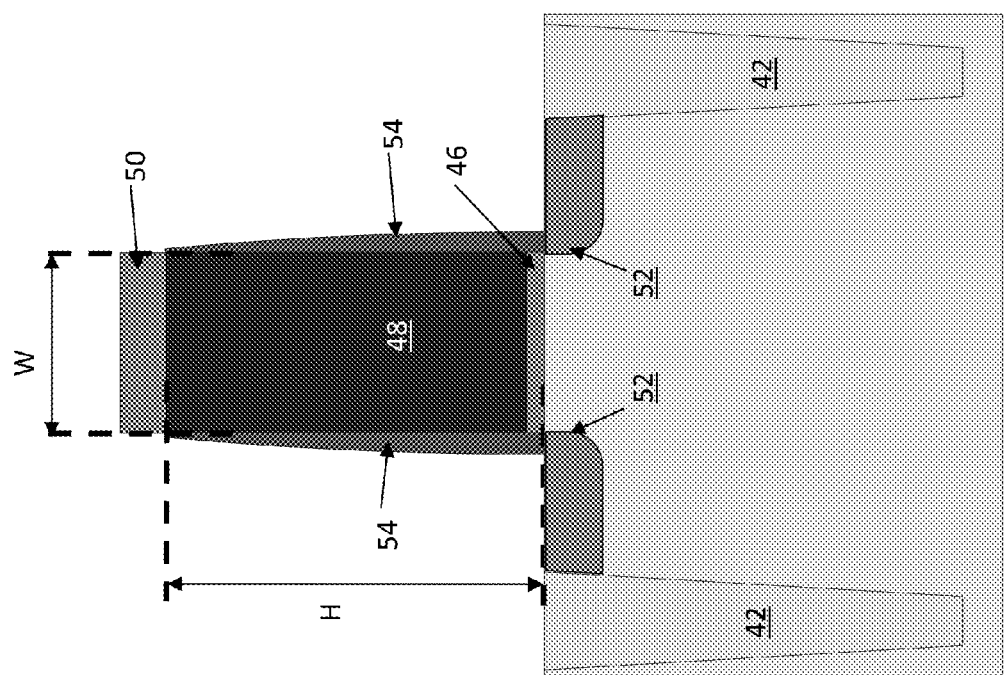

In FIG. 3, a dummy dielectric layer is formed on the substrate 40. The dummy dielectric layer may be, for example, silicon oxide, silicon nitride, a combination thereof, or the like, and may be deposited or thermally grown according to acceptable techniques, such as CVD, thermal oxidation, or the like. A dummy gate layer is formed over the dummy dielectric layer. The dummy gate layer may be deposited, such as by using CVD or the like, over the dummy dielectric layer and then planarized, such as by a CMP. The dummy gate layer may comprise, for example, polysilicon, although other materials that have a high etching selectivity may also be used. A mask layer is then formed over the dummy gate layer. The mask layer may be deposited, such as by using CVD or the like, over the dummy gate layer. The mask layer may comprise, for example, silicon nitride, silicon oxynitride, silicon carbon nitride, or the like.

The mask layer may be patterned using acceptable photolithography and etching techniques to form mask 50. The pattern of the mask 50 then may be transferred to the dummy gate layer and dummy dielectric layer by an acceptable etching technique to form dummy gates 48 and dummy gate dielectrics 46 from the dummy gate layer and the dummy dielectric layer, respectively. The etching may comprise an acceptable anisotropic etching, such as RIE, NBE, or the like. A width W of the dummy gate 48 and dummy gate dielectric 46 can be in range from about 10 nm to about 300 nm, such as about 20 nm. Dummy gate 48 and dummy gate dielectric 46 has a combined height H. The height H can be in range from about 50 nm to about 200 nm, such as about 100 nm. An aspect ratio of the height H to width W can be in a range from about 1 to about 10, such as about 5. The dummy gate 48 covers a channel region in the substrate 40.

Implants for lightly doped source/drain (LDD) regions may be performed. Similar to the implants discussed above, a mask, such as a photoresist, may be formed and patterned over the substrate 40, and p-type impurities may be implanted into the exposed substrate 40 in the LDD regions of a p-type device. The mask may then be removed. The p-type impurities may be boron, BF$_2$, or the like. The lightly doped source/drain regions 52 may have a concentration of impurities from about $10^{15}$ cm$^{-3}$ to about $10^{16}$ cm$^{-3}$. An anneal may be used to activate the implanted impurities.

Other embodiments are possible. For example, in the manufacturing of an n-type device, n-type impurities may be implanted into substrate 40 in the LDD regions of an n-type device, instead of p-type impurities, using the same or similar processes to those described above. The n-type impurities may be any of the n-type impurities previously discussed or the like, and may be implanted to a concentration of equal to or less than $10^{18}$ cm$^{-3}$, such as between about $10^{17}$ cm$^{-3}$ and about $10^{18}$ cm$^{-3}$.

Gate spacers 54 are formed along sidewalls of the dummy gate 48 and dummy gate dielectric 46. The gate spacers 54 may be formed by conformally depositing, such as by CVD or the like, a material and subsequently anisotropically etching the material. The material of the gate spacers 54 may be silicon nitride, silicon carbon nitride, a combination thereof, or the like.

Figure 4:
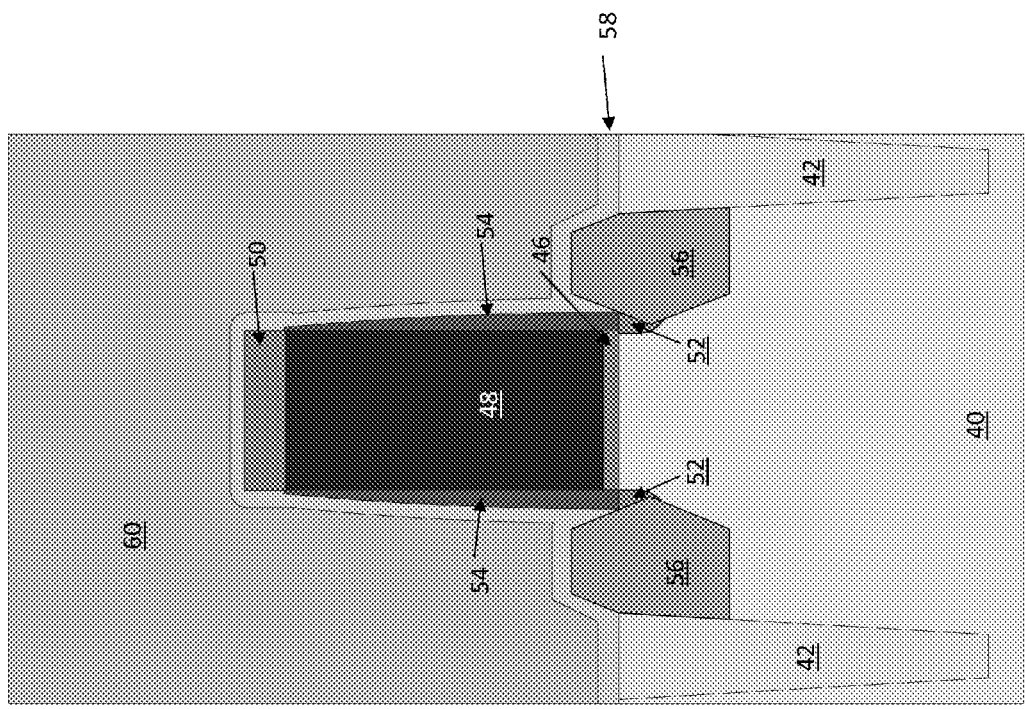

Referring to FIG. 4, epitaxial source/drain regions 56 are formed in the substrate 40. A hardmask layer may be formed overlying substrate 40. The hardmask layer can be silicon nitride, silicon carbon nitride, silicon oxynitride, silicon carbon oxynitride, the like, or a combination thereof deposited by CVD or the like. Other materials and methods of forming the hardmask layer may be used. The hardmask layer may be patterned to expose the regions of the substrate 40 where the device is to be formed using any acceptable photolithography and etching process, such as RIE, NBE, or the like. Once the hardmask layer has been patterned, an etch selective to the substrate 40 is performed. The etch can be any acceptable etch, such as a dry or wet etch, which may be anisotropic or isotropic. The etch recesses source/drain regions in substrate 40. The epitaxial source/drain regions 56 are then epitaxially grown in the recesses. The epitaxial growth may be by using Metal-Organic Chemical Vapor Deposition (MOCVD), Molecular Beam Epitaxy (MBE), Liquid Phase Epitaxy (LPE), Vapor Phase Epitaxy (VPE), the like, or a combination thereof. The epitaxial source/drain regions 56 may comprise any acceptable material, such as appropriate for the device type, e.g., p-type. For example, the epitaxial source/drain regions 56 for a p-type device may comprise SiGe, SiGeB, Ge, GeSn, or the like. Then, the hardmask layer may be removed, for example, using an etch selective to the material of the hardmask layer.

Other embodiments are possible. For example, in the manufacturing of an n-type device, epitaxial source/drain regions may comprise silicon, SiC, SiCP, SiP, or the like, and the epitaxial source/drain regions may be formed using the same or similar processes as those described above.

The epitaxial source/drain regions 56 may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The p-type impurities for source/drain regions for a p-type device may be any of the p-type impurities previously discussed. In the case of an n-type device, the n-type impurities may be any of the n-type impurities previously discussed. In other embodiments, the epitaxial source/drain regions 56 may be in situ doped during growth.

In FIG. 4, an etch stop layer (ESL) 58 is conformally formed on the epitaxial source/drain regions 56, gate spacers 54, mask 50, and isolation regions 42. In some embodiments, the ESL 58 may comprise silicon nitride, silicon carbon nitride, or the like, formed using Atomic Layer Deposition (ALD), CVD, the like, or a combination thereof. A bottom inter-layer dielectric (ILD0) 60 is deposited over the ESL 58. ILD0 60 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 5:
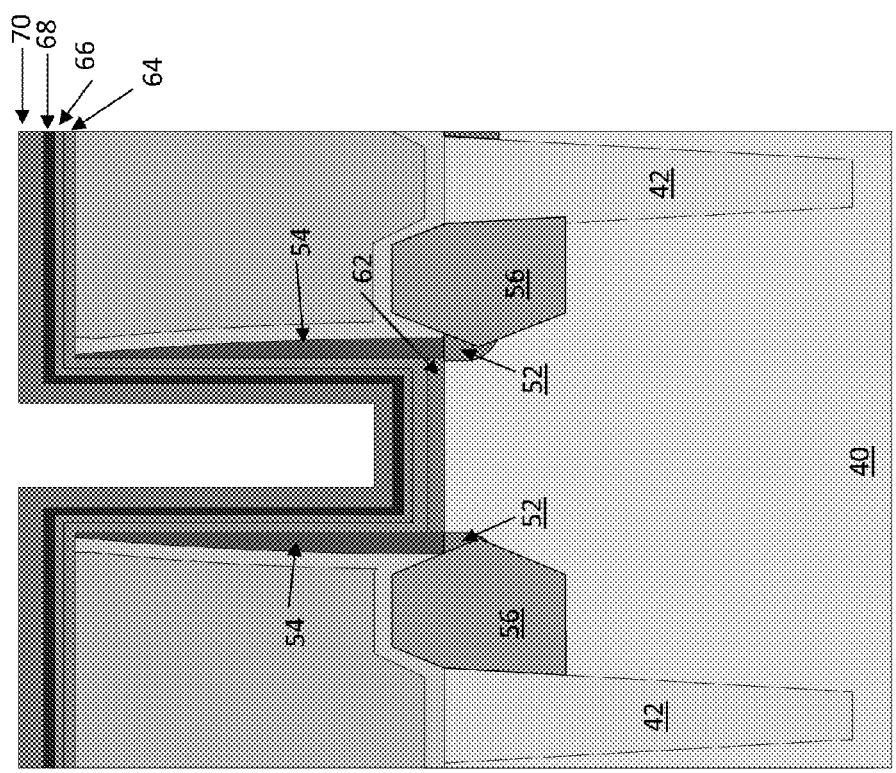
Figure 6:
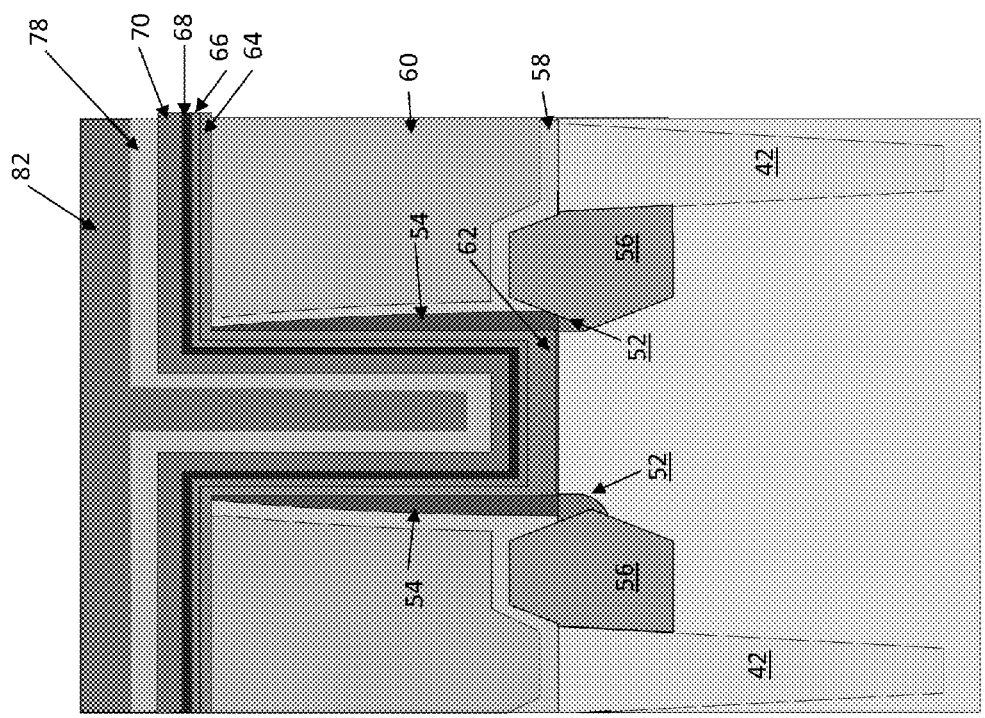

In FIG. 5, a planarization process, such as a CMP, is performed to level the top surface of ILD0 60 with the top surfaces of the dummy gate 48. The CMP may also remove the mask 50 and the ESL 58 from over the dummy gate 48. Accordingly, a top surface of the dummy gate 48 is exposed through the ILD0 60. The dummy gate 48 and the dummy gate dielectric 46 are removed in an etching step(s), so that an opening through the ILD0 60 and defined by the gate spacers 54 is formed in the substrate 40. The opening may have an aspect ratio corresponding to the width W and height H discussed above with respect to FIG. 3 since the opening is defined by the removal of the dummy gate 48 and dummy gate dielectric 46. The opening exposes a channel region in a respective active area in the substrate 40. The channel region is disposed between a pair of epitaxial source/drain regions 56. The etching step(s) may be selective to the materials of the dummy gate 48 and the dummy gate dielectric 46, which etching may be a dry or wet etching. During the etching, the dummy gate dielectric 46 may be used as an etch stop layer when the dummy gate 48 is etched. The dummy gate dielectric 46 may then be etched after the removal of the dummy gates 48. Although not specifically illustrated, depending on the similarity of materials used for the ILD0 60 and the dummy gate dielectric 46, the ILD0 60 may be recessed when the dummy gate dielectric 46 is removed, and this recessing may cause portions of the ESL 58 and/or gate spacers 54 to protrude above the top surface of the ILD0 60.

An interfacial dielectric 62 is formed in each opening and on the substrate 40. The interfacial dielectric 62 may be, for example, an oxide or the like formed by thermal oxidation, chemical oxidation, ALD, or the like. A thickness of the interfacial dielectric 62 may be in a range from about 5 Å to about 15 Å, such as about 8 Å. A gate dielectric layer 64 is then formed conformally on the top surface of the ILD0 60 and in the openings along sidewalls of the gate spacers 54 and on the interfacial dielectric 62. In some embodiments, the gate dielectric layer 64 comprises a high-k dielectric material, and in these embodiments, the gate dielectric layer 64 may have a k value greater than about 7.0, and may include a metal oxide or a silicate of Hf, Al, Zr, La, Mg, Ba, Ti, Pb, and combinations thereof. The formation methods of gate dielectric layer 64 may include ALD, CVD, Molecular-Beam Deposition (MBD), the like, or a combination thereof. A thickness of the gate dielectric layer 64 may be in a range from about 5 Å to about 25 Å, such as about 10 Å.

A capping layer is then formed conformally on the gate dielectric layer 64. In the illustrated embodiment, the capping layer comprises a first sub-layer 66 and a second sub-layer 68. In some embodiments, the capping layer may be a single layer or may comprise additional sub-layers. The capping layer may function as a barrier layer to prevent a subsequently deposited metal-containing material from diffusing into the gate dielectric layer 64. Further, the second sub-layer 68, as illustrated, can function as an etch stop during the formation of a work function tuning layer if the first sub-layer 66 is formed from a same material as the work function tuning layer, for example if different layers are to be formed in different regions, which may include using an etch. The first sub-layer 66 can comprise titanium nitride (TiN) or the like deposited conformally on the gate dielectric layer 64 by ALD, CVD, or the like. The second sub-layer 68 can comprise tantalum nitride (TaN) or the like deposited conformally on the first sub-layer 66 by ALD, CVD, or the like. A thickness of the capping layer may be in a range from about 5 Å to about 20 Å, such as about 10 Å. In the illustrated embodiment, a thickness of the first sub-layer 66 may be in a range from about 5 Å to about 20 Å, such as about 10 Å, and a thickness of the second sub-layer 68 may be in a range from about 5 Å to about 20 Å, such as about 10 Å.

A first work function tuning layer 70 is then formed conformally on the capping layer, e.g., on the second sub-layer 68. The first work function tuning layer 70 may be any acceptable material with any acceptable thickness to tune a work function of a device, such as a p-type device, to a desired amount given the application of the device to be formed, and may be deposited using any acceptable deposition process. In some embodiments, the first work function tuning layer 70 comprises titanium nitride (TiN) or the like deposited by ALD, CVD, or the like. A thickness of the first work function tuning layer 70 may be in a range from about 15 Å to about 50 Å, such as about 25 Å.

A layer of a metal-containing material, such as a layer of metal-containing compound 78, is then formed conformally on the barrier layer 76. A metal-containing material, as used herein, is a material containing a metal and a nonmetal (e.g., N, C, O, etc.), where the non-metal is present in a concentration greater that what may naturally or incidentally occur by deposition of the metal alone, as one of skill in the art would understand. The metal-containing compound 78 may be a tungsten-based compound. For example, the metal-containing compound 78 may be $WN_x$, $WC_x$, $WC_xN_y$, and/or $WC_xN_yO_z$, or a combination thereof. Other tungsten-based compounds may be used in some embodiments. In some embodiments, a tungsten-based metal-containing compound layer enables the device to further tune the work function of the device to achieve a greater threshold voltage tuning. For example, a tungsten-based metal-containing compound layer as described herein may enable the device to achieve threshold voltages from about 0.1V to about 0.4V, such as about 0.2V. In some embodiments, the increased work function tuning provided by a tungsten-based metal-containing compound layer allows for work function tuning layer 70 to be thinner while still achieving a desired threshold voltage for the device, which may improve manufacturing of the device. For example, thinner work function tuning layers may help to reduce or eliminate problems in filling the gate opening with a subsequent metal layer, which may be difficult where the opening is too narrow because of thicker work function tuning layers. In some embodiments, the tungsten-based metal-containing compound layer may have a smaller resistivity and may reduce the overall gate resistivity, which may be useful in some applications. In some embodiments, the tungsten-based metal-containing compound layer may help to block diffusion of certain elements, for example copper and/or fluorine.

In some embodiments, the work function of the metal-containing compound 78 may be tuned by changing the composition of the accompanying non-metal elements, for example nitrogen, carbon and/or oxygen. For example, when metal-containing compound 78 is comprised of $WN_x$, the work function of the layer may be tuned by changing the concentration of $N_x$. In the case of $WN_x$, the concentration of $N_x$ may be varied from about 0% to about 50% for work function tuning, and more specifically from about 15% to about 30%. Other concentrations and other compounds may be used in some embodiments.

The metal-containing compound 78 may be deposited using any acceptable deposition process. In some embodiments, the layer of a metal-containing compound 78 is or the like deposited by physical vapor deposition (PVD), ALD, CVD, or the like. A thickness of the layer of the metal-containing compound 78 may be in a range from about 10 Å to about 50 Å, such as about 25 Å.

A metal 82 is formed on the metal-containing compound 78. A work function of the metal-containing compound 78 is greater than a work function of metal 82. In some embodiments, the metal 82 is comprised of tungsten. The metal 82 may be deposited using any acceptable deposition process, such as PVD, CVD, ALD, or the like. The metal 82 fills the unfilled portions of the openings.

Figure 7:
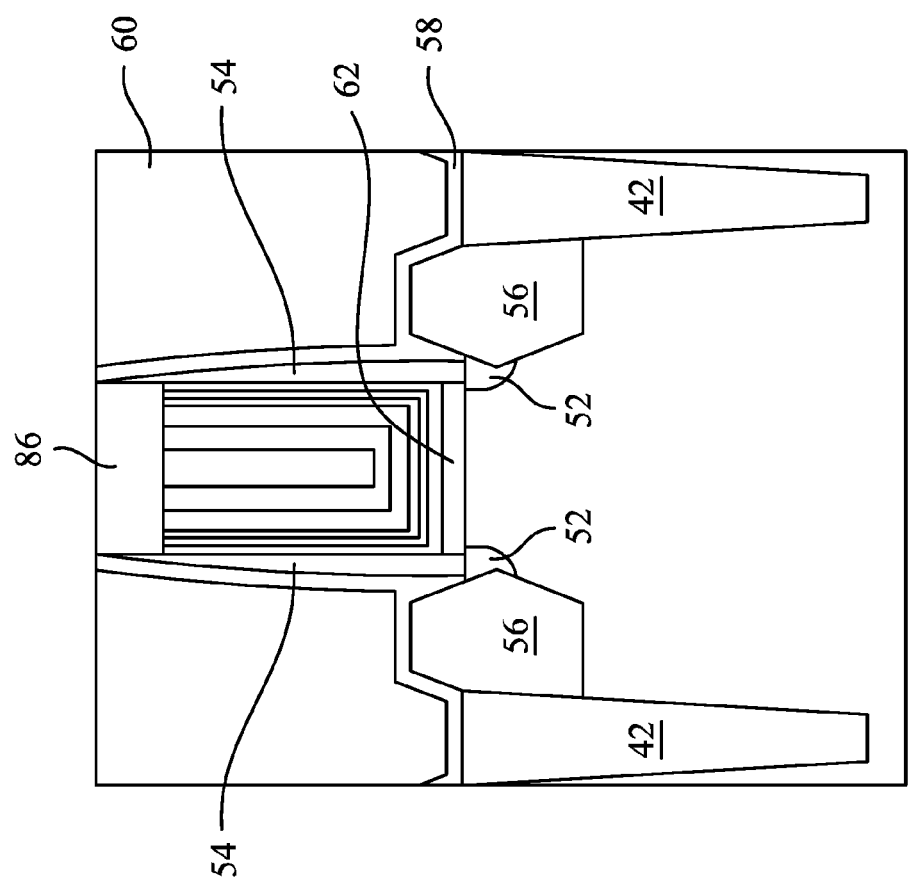

In FIG. 7, a planarization process, such as a CMP, may be performed to remove the excess portions of metal-containing compound 78, metal 82, and the layers 64, 66, 68, and 70, which excess portions are over the top surface of ILD0 60. Then, a controlled etch-back selective to the metal-containing compound 78, metal 82 and the layers 64, 66, 68, and 70 is performed to recess those materials, which results in the gate structures illustrated in FIG. 7, from the top surface of the ILD0 60. The etch-back may comprise an acceptable anisotropic etching, such as RIE, NBE, or the like.

Dielectric cap 86 is formed in the recessed areas formed by the etch-back. To form the dielectric cap 86, a cap dielectric layer can be deposited in the openings and on the top surface of the ILD0 60. The cap dielectric layer may comprise silicon nitride, silicon carbon nitride, or the like, formed using CVD, PECVD, or the like. The cap dielectric layer can then be planarized, such as by CMP, to form top surfaces co-planar with the top surface of the ILD0 60 thereby forming the dielectric cap.

Figure 8:
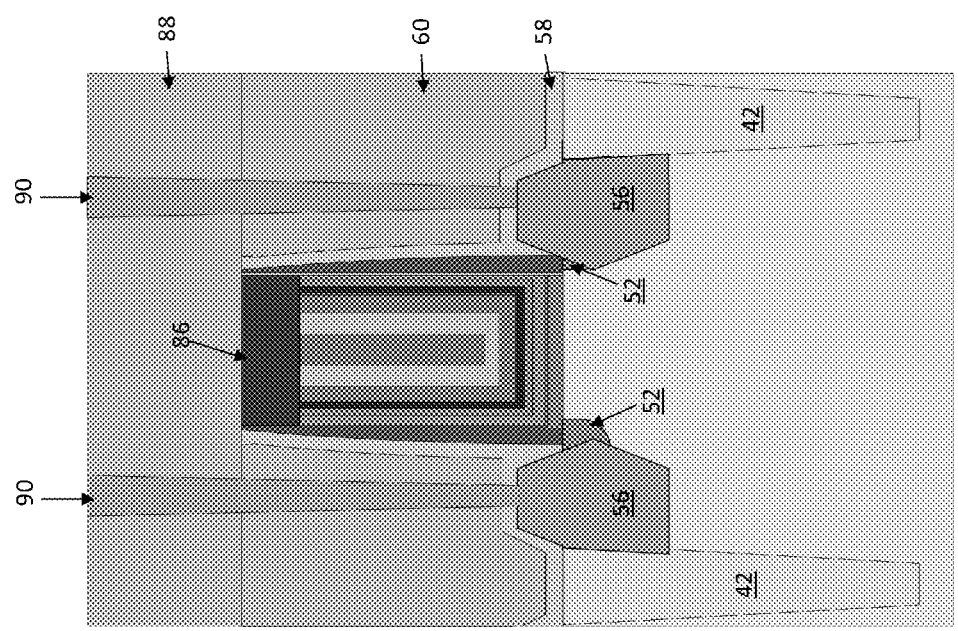

In FIG. 8, an upper ILD (ILD1) 88 is deposited over the ILD0 60 and the dielectric cap 86, and contacts 90 are formed through the ILD1 88, ILD0 60, and ESL 58 to the epitaxial source/drain regions 56. ILD1 88 is formed of a dielectric material such as PSG, BSG, BPSG, USG, or the like, and may be deposited by any suitable method, such as CVD and PECVD. Openings for contacts 90 are formed through the ILD1 88, ILD0 60, and ESL 58. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a top surface of the ILD1 88. The remaining liner and conductive material form contacts 90 in the openings. An anneal process may be performed to form a silicide at the interface between the epitaxial source/drain regions 56 and the contacts 90, respectively.

FIG. 8 illustrates a p-type FET device. The device may have a tuned threshold voltage due to the metal-containing compound 78, metal 82, and the layers 64, 66, 68 and 70, included in the gate structure.

Although not explicitly shown, a person having ordinary skill in the art will readily understand that further processing steps may be performed on the structure in FIG. 8. For example, various Inter-Metal Dielectrics (IMD) and their corresponding metallizations may be formed over ILD1 88.

Some embodiments may achieve advantages. In some embodiments, as described earlier, metal-containing compound 78, which may be tungsten-based, may enable the device to further tune the work function to achieve greater threshold voltage tuning than is possible using only work function tuning layer 70. For example, metal-containing compound 78, such as a tungsten-based material as described herein, may enable the device to achieve threshold voltages from about 0.1V to about 0.4V, such as about 0.2V. In some embodiments, the increased work function tuning provided by a tungsten-based metal-containing compound layer allows for work function tuning layer 70 to be thinner while still achieving a required threshold voltage, which may improve manufacturing of the device. For example, thinner work function tuning layers may help to reduce or eliminate problems in filling the gate opening with a subsequent metal layer, which may be difficult where the opening is too narrow because of thicker work function tuning layers. In some embodiments, the tungsten-based metal-containing compound layer may have a smaller resistivity and may reduce the overall gate resistivity, which may be helpful in some applications. In some embodiments, the tungsten-based metal-containing compound layer may help to block diffusion of certain elements, for example copper and/or fluorine.

In accordance with some embodiments, a method includes forming a first source/drain region and a second source/drain region in a substrate. A gate structure is formed between the first source/drain region and the second source/drain region and over the substrate. The gate structure includes a gate dielectric layer over the substrate, a work function tuning layer over the gate dielectric layer, a metal-containing compound over the work function tuning layer, and a metal over the metal-containing compound. The metal-containing compound includes the metal as an element of the compound. The metal-containing compound also includes C, N, O, or a combination thereof.

In accordance with some embodiments, a method includes forming a first source/drain region and a second source/drain region in a substrate. An inter-layer dielectric is formed over the substrate, with an opening through the inter-layer dielectric to the substrate between the first source/drain region and the second source/drain region. A gate dielectric layer is formed in the opening and over the substrate. A work function tuning layer is formed in the opening and over the gate dielectric layer. A metal-containing compound is formed in the opening and over the work function tuning layer. Metal is formed in the opening and over the metal-containing compound. The metal-containing compound includes the metal as an element of the metal-containing compound, and the metal-containing compound has a greater work function that the metal.

In accordance with some embodiments, a structure includes a first source/drain region and a second source/drain region in a substrate and a gate structure on the substrate and between the first source/drain region and the second source/drain region. The gate structure includes a gate dielectric layer over the substrate, a work function tuning layer over the gate dielectric layer, a metal-containing compound over the work function tuning layer, and a metal over the metal-containing compound. The metal-containing compound includes the metal as an element of the metal-containing compound, and the metal-containing compound has a greater work function that the metal. The structure includes an inter-layer dielectric over the substrate and around the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first epitaxial source/drain region and a second epitaxial source/drain region in a substrate;
    forming a gate structure between the first epitaxial source/drain region and the second epitaxial source/drain region and over the substrate, wherein forming the gate structure comprises:
        forming an interfacial dielectric layer over the substrate;
        forming a gate dielectric layer over the interfacial dielectric layer;
        forming a titanium nitride (TiN) layer over the gate dielectric layer;
        forming a tantalum nitride (TaN) layer over the TiN layer;
        forming a work function tuning layer over the TaN layer, the work function tuning layer comprising TiN;
        forming a metal-containing compound over the work function tuning layer, the metal-containing compound comprising tungsten (W), the metal-containing compound further comprising C, N, O, or a combination thereof;
        forming a tungsten layer over the metal-containing compound; and
        forming a dielectric cap over topmost surfaces of the interfacial dielectric layer, the gate dielectric layer, the TiN layer, the TaN layer, the work function tuning layer, the metal-containing compound, and the tungsten layer;
    forming a first spacer on a first sidewall of the gate structure, the first spacer being in physical contact with the dielectric cap, the first spacer extending along a first sidewall of the dielectric cap, at least a portion of the first epitaxial source/drain region being disposed below the first spacer; and
    forming an etch stop layer along a sidewall of the first spacer and over the first epitaxial source/drain region and the second epitaxial source/drain region.

2. The method of claim 1, wherein the metal-containing compound comprises $WN_x$.

3. The method of claim 2, wherein an N concentration of the metal-containing compound is between 0 and 50 percent.

4. The method of claim 1, wherein the metal-containing compound comprises $WC_x$.

5. The method of claim 1, wherein the metal-containing compound comprises $WC_xN_y$.

6. The method of claim 1, wherein the metal-containing compound comprises $WC_xN_yO_z$.

7. The method of claim 1, further comprising tuning the work function of the metal-containing compound by changing a concentration of nitrogen in the metal-containing compound.

8. The method of claim 1, further comprising tuning the work function of the metal-containing compound by changing a concentration of oxygen in the metal-containing compound.

9. The method of claim 1, wherein the first epitaxial source/drain region and the second epitaxial source/drain region are doped with a p-type dopant.

10. A method comprising:
    forming a dummy gate structure over a substrate;
    forming spacers on opposing sidewalls of the dummy gate structure;
    forming a first epitaxial source/drain region and a second epitaxial source/drain region in the substrate, the dummy gate structure being interposed between the first epitaxial source/drain region and the second epitaxial source/drain region;
    forming an etch stop layer over the dummy gate structure, the first epitaxial source/drain region and the second epitaxial source/drain region;
    forming an inter-layer dielectric over the spacers, the dummy gate structure and the substrate, the etch stop layer being interposed between the spacers and the inter-layer dielectric;
    removing the dummy gate structure to form an opening through the inter-layer dielectric;
    forming a gate dielectric layer in the opening and over the substrate;
    forming a titanium nitride (TiN) layer over the gate dielectric layer;
    forming a tantalum nitride (TaN) layer over the TiN layer;
    forming a work function tuning layer in the opening and over the TaN layer, the work function tuning layer comprising TiN;
    forming a metal-containing compound in the opening and over the work function tuning layer, the metal-containing compound comprising tungsten (W);
    forming a tungsten layer in the opening and over the metal-containing compound, wherein the tungsten layer overfills the opening, and wherein the metal-containing compound has a greater work function than tungsten;
    recessing the gate dielectric layer, the TiN layer, the TaN layer, the work function tuning layer, the metal-containing compound, and the tungsten layer below a topmost surface of the inter-layer dielectric to form a recess in the inter-layer dielectric, the recess exposing sidewalls of the spacers; and
    forming a dielectric cap in the recess, a topmost surface of the dielectric cap being co-planar with the topmost surface of the inter-layer dielectric, the dielectric cap being in physical contact with the sidewalls of the spacers.

11. The method of claim 10, wherein the metal-containing compound comprises $WN_x$.

12. The method of claim 11, wherein a nitrogen concentration of the metal-containing compound is between about 0 and 50 percent.

13. The method of claim 10, wherein the metal-containing compound comprises $WC_x$.

14. The method of claim 10, wherein the metal-containing compound comprises $WC_xN_y$.

15. The method of claim 10, wherein the metal-containing compound comprises $WC_xN_yO_z$.

16. A structure comprising:
    a first epitaxial source/drain region and a second epitaxial source/drain region in a substrate;
    a gate structure on the substrate and between the first epitaxial source/drain region and the second epitaxial source/drain region, the gate structure comprising:
        a gate dielectric layer over the substrate;
        a titanium nitride (TiN) layer over the gate dielectric layer;
        a tantalum nitride (TaN) layer over the TiN layer;
        a work function tuning layer over the TaN layer, the work function tuning layer comprising TiN;

a tungsten-containing compound over the work function tuning layer;

a tungsten layer over the tungsten-containing compound, wherein the tungsten-containing compound has a greater work function than tungsten; and a dielectric cap over the tungsten layer, the dielectric cap being in physical contact with the gate dielectric layer, the TiN layer, the TaN layer, the work function tuning layer, the tungsten-containing compound, and the tungsten layer;

a spacer on a sidewall of the gate structure, the spacer being in physical contact with the dielectric cap, the spacer extending along a sidewall of the dielectric cap;

an inter-layer dielectric over the substrate and around the gate structure, a topmost surface of the inter-layer dielectric being co-planar with a topmost surface of the dielectric cap; and an etch stop layer separating the spacer, the first epitaxial source/drain region and the second epitaxial source/drain region from the inter-layer dielectric.

17. The method of claim 1, further comprising:

forming a first isolation region in the substrate adjacent the first epitaxial source/drain region; and forming a second isolation region in the substrate adjacent the second epitaxial source/drain region, the first epitaxial source/drain region and the second epitaxial source/drain region being interposed between the first isolation region and the second isolation region, the dielectric cap being in physical contact with topmost surfaces of the first isolation region and the second isolation region.

18. The method of claim 1, further comprising:

forming a second spacer on a second sidewall of the gate structure, the second sidewall of the gate structure being opposite the first sidewall of the gate structure, the second spacer being in physical contact with the dielectric cap, the second spacer extending along a second sidewall of the dielectric cap, the second sidewall of the dielectric cap being opposite the first sidewall of the dielectric cap, at least a portion of the second epitaxial source/drain region being disposed below the second spacer.

19. The method of claim 10, further comprising, before recessing the gate dielectric layer, the TiN layer, the TaN layer, the work function tuning layer, the metal-containing compound, and the tungsten layer, removing portions of the gate dielectric layer, the TiN layer, the TaN layer, the work function tuning layer, the metal-containing compound, and the tungsten layer over the topmost surface of the inter-layer dielectric to expose the topmost surface of the inter-layer dielectric.

20. The structure of claim 16, wherein at least a portion of the first epitaxial source/drain region is disposed in the substrate below the spacer.

* * * * *